(12) United States Patent
Ishibashi et al.

(10) Patent No.: US 8,979,307 B2
(45) Date of Patent: Mar. 17, 2015

(54) LED MOUNTING CIRCUIT BOARD, BELT-LIKE FLEXIBLE LED LIGHT AND LED ILLUMINATING DEVICE USING THE SAME

(71) Applicant: Atex Co., Ltd., Fukuoka (JP)

(72) Inventors: Kazuo Ishibashi, Fukuoka (JP); Suetoshi Hinago, Fukuoka (JP)

(73) Assignee: Atex Co., Ltd., Fukuoka (JP)

( * ) Notice: Subject to any disclaimer, the term of this patent is extended or adjusted under 35 U.S.C. 154(b) by 217 days.

(21) Appl. No.: 13/665,034

(22) Filed: Oct. 31, 2012

(65) Prior Publication Data

US 2013/0107526 A1 May 2, 2013

(30) Foreign Application Priority Data

Oct. 31, 2011 (JP) ................................. 2011-239028
May 18, 2012 (JP) ................................. 2012-114755

(51) Int. Cl.
| | | |
|---|---|---|
| F21S 4/00 | (2006.01) | |
| F21V 21/00 | (2006.01) | |
| F21Y 101/02 | (2006.01) | |
| F21Y 103/00 | (2006.01) | |
| F21Y 113/00 | (2006.01) | |

(52) U.S. Cl.
CPC .............. *F21S 4/007* (2013.01); *F21Y 2101/02* (2013.01); *F21Y 2103/003* (2013.01); *F21Y 2113/005* (2013.01); *Y10S 362/80* (2013.01)
USPC ....................................... 362/249.02; 362/800

(58) Field of Classification Search
CPC ... F21S 4/00–4/008; F21Y 2103/00–2103/003
USPC ................ 362/249.02, 255–256, 311.02, 800
See application file for complete search history.

(56) References Cited

U.S. PATENT DOCUMENTS

| | | | | |
|---|---|---|---|---|
| 3,351,409 | A * | 11/1967 | McGuire ........................ | 359/460 |
| 7,377,787 | B1 | 5/2008 | Eriksson | |
| 7,380,961 | B2 * | 6/2008 | Moriyama et al. ............ | 362/238 |
| 2008/0067526 | A1 | 3/2008 | Chew | |
| 2010/0007817 | A1 | 1/2010 | Kim | |

FOREIGN PATENT DOCUMENTS

| | | |
|---|---|---|
| CN | 101198216 | 6/2008 |
| CN | 201187696 | 1/2009 |
| CN | 201655800 | 11/2010 |
| CN | 201892147 | 7/2011 |
| JP | 5-43184 | 2/1993 |
| JP | 6-314858 | 11/1994 |

(Continued)

*Primary Examiner* — Jason Moon Han
(74) *Attorney, Agent, or Firm* — Wenderoth, Lind & Ponack, L.L.P.

(57) ABSTRACT

A belt-like flexible LED light can be bent in both an orthogonal direction to a light emitting direction and a vertical direction. Additionally, a circuit board and LED illuminating device are capable of implementing the LED light. An LED mounting circuit board, in which an LED mounting portion has a plurality of LEDs mounted in an array, is provided on a central part in a transverse direction of a long belt-like flexible board. Both sides of the LED mounting circuit board are in a transverse direction of the LED mounting portion and are provided with a first board and a second board having a feed pattern for causing a current to flow to the LEDs formed thereon. The LED mounting portion, the first board and second board are formed to be bendable and are used with the belt-like flexible LED light.

15 Claims, 13 Drawing Sheets

(56) References Cited

FOREIGN PATENT DOCUMENTS

| | | |
|---|---|---|
| JP | 3020888 | 11/1995 |
| JP | 9-297549 | 11/1997 |
| JP | 11-38917 | 2/1999 |
| JP | 2002-93204 | 3/2002 |
| JP | 2002-197901 | 7/2002 |
| JP | 2002-232009 | 8/2002 |
| JP | 3098840 | 10/2003 |
| JP | 2004-526185 | 8/2004 |
| JP | 3897260 | 1/2007 |
| JP | 2007-67410 | 3/2007 |
| JP | 3138582 | 12/2007 |
| WO | 02/061328 | 8/2002 |

* cited by examiner

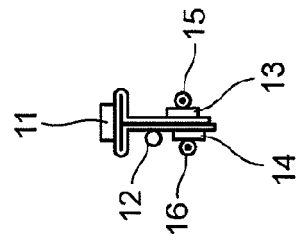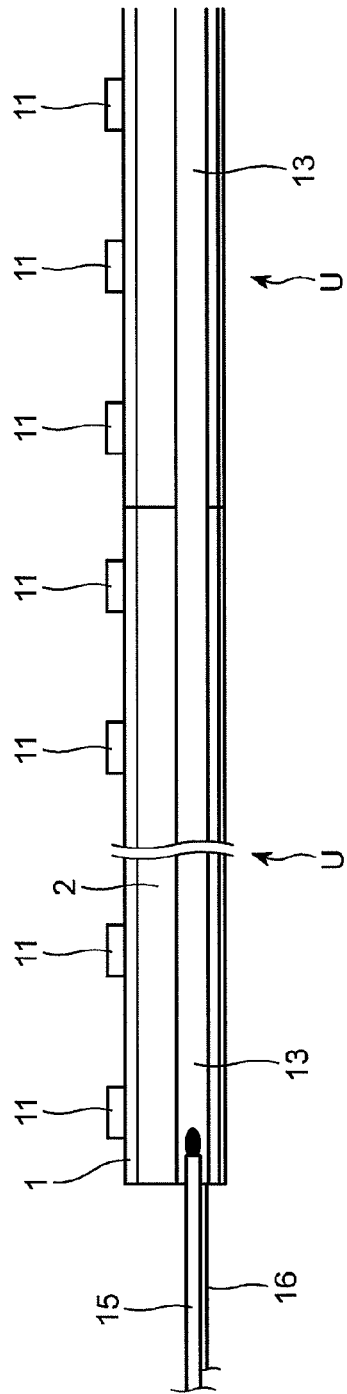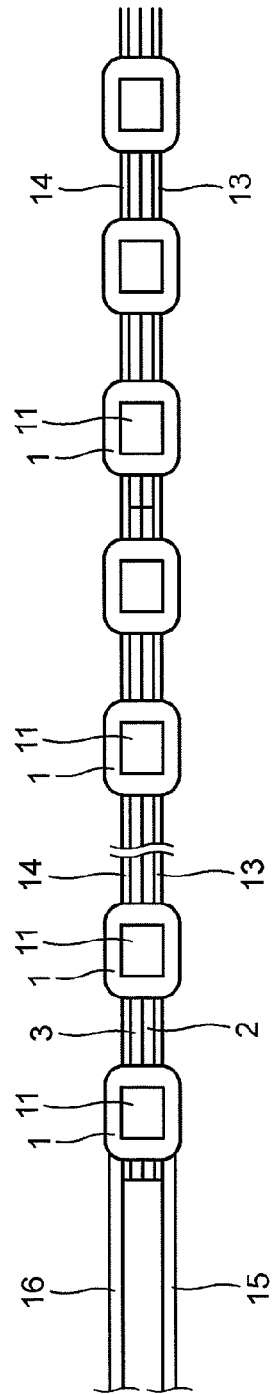

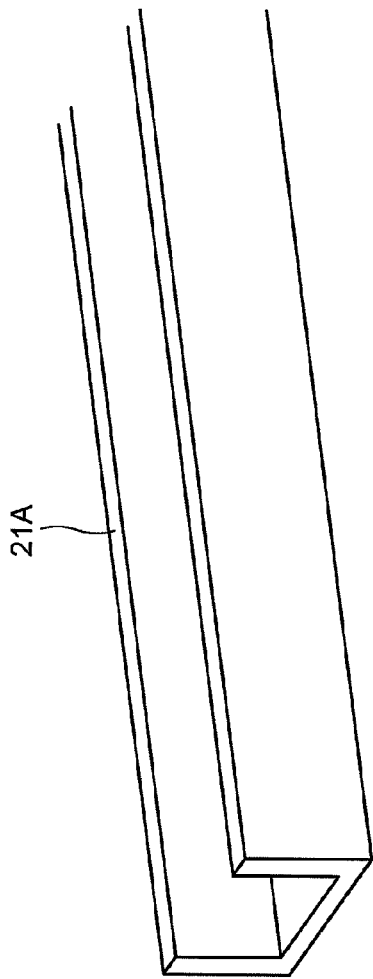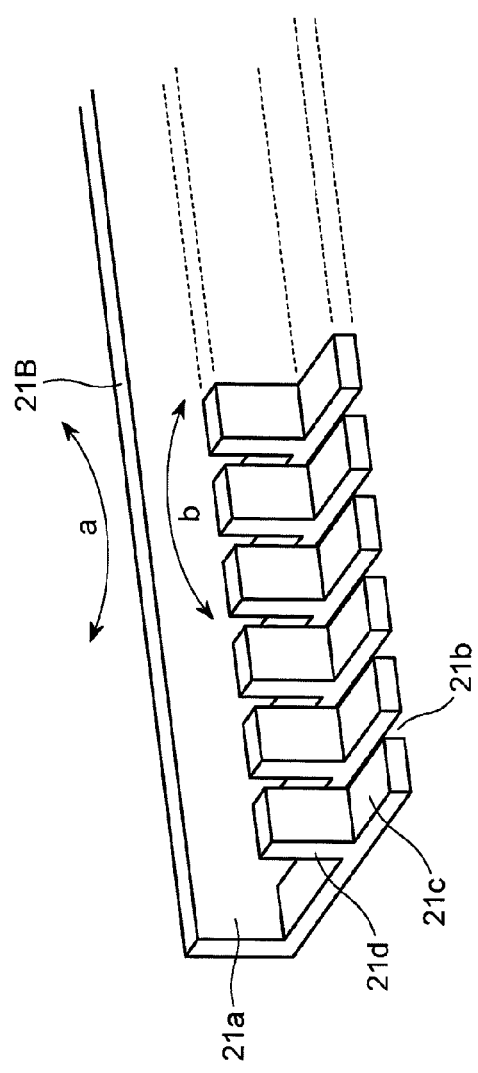

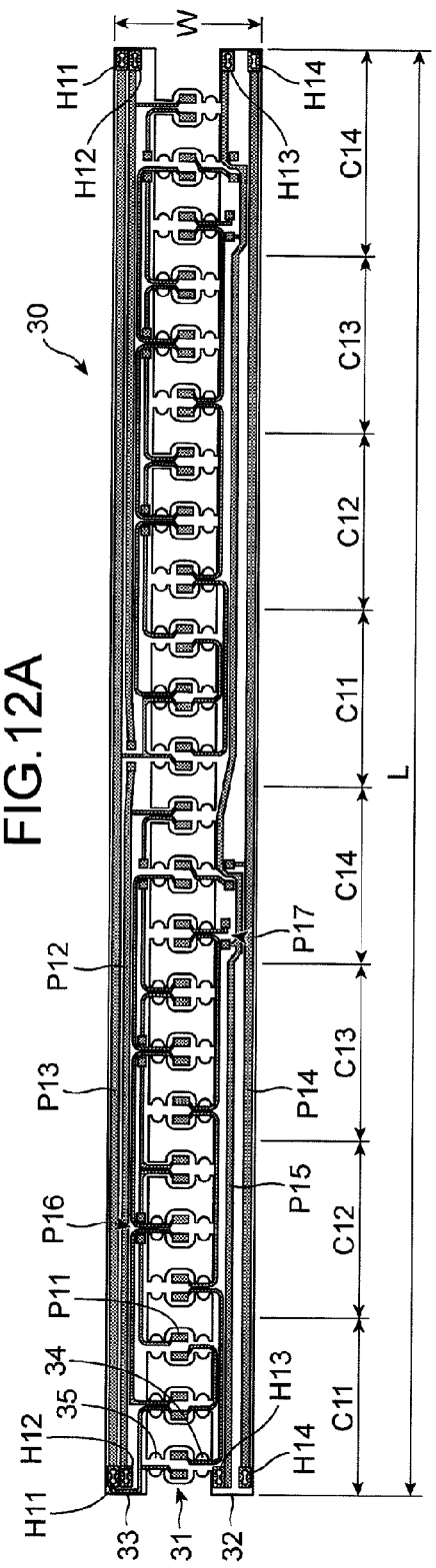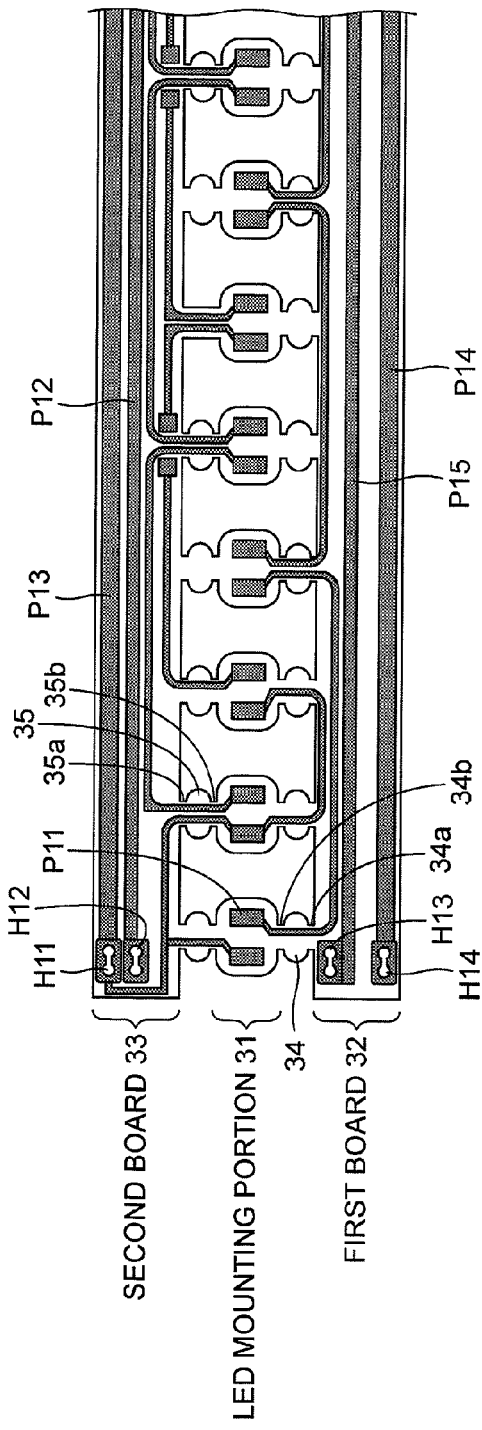

LED MOUNTING CIRCUIT BOARD, BELT-LIKE FLEXIBLE LED LIGHT AND LED ILLUMINATING DEVICE USING THE SAME

FIELD OF THE INVENTION

1. Background of the Invention

The present invention relates to an LED (light emitting diode) mounting circuit board having a flexibility, a belt-like flexible LED light and an LED illuminating device using the same.

2. Description of the Related Art

When a plurality of SMD (Surface Mount Device surface mounting) type LEDs (Light Emitting Diodes) is linearly mounted on a circuit board and is turned ON, an LED light emitting direction is generally equivalent to a perpendicular direction to the circuit board. In this case, if the circuit board is manufactured by a belt-like FPC (Flexible Printed Circuit) which can easily be bent, it is possible to form a belt-like light emitting module which can be curved in the LED light emitting direction. A large number of products are fabricated as a tape light (for example, see Japanese Unexamined Patent Publication No. 2002-197901, Japanese Unexamined Patent Publication No. 2002-232009, Japanese Unexamined Patent Publication No. 2007-67410, and Japanese Utility Model Registration No. 3138582).

To the contrary, with this structure, it is hard to carry out curving in a perpendicular direction (a transverse direction of the belt-like FPC) to the LED light emitting direction until the belt-like light emitting module is twisted. The reason is as follows. The belt-like FPC requires a width of at least 7 mm in order to mount a component, thereby forming the circuit. Thus, it is impossible to carry out bending in the transverse direction.

A method of bending the FPC board in the perpendicular direction to the light emitting direction includes a method using a lateral light emitting LED and a method using a lamp type LED. In the case of the lateral light emitting LED, the LED light emitting direction is equivalent to the transverse direction of the board. Therefore, the belt-like board formed by the FPC is bent in the perpendicular direction to the light emitting direction. The case of the shell type LED is the same. An example of a flexible luminous body using the shell type LED is disclosed in Japanese Unexamined Utility Model Publication No. 5-43184, Japanese Utility Model Registration No. 3020888, Japanese Translation of PCT Publication No. 2004-526185, Japanese Utility Model Registration No. 3098840, and Japanese Patent No. 3897260.

On the other hand, an example in which the FPC board is not used includes a flexible linear luminous body in which at least one series circuit having light emitting diodes and current limiting resistors connected in series is connected in parallel between a pair of two positive and negative feed wires or more disposed in a spiral or crossing shape, and these feed wires are covered with a soft synthetic resin having a translucency to take a flexible linear shape as described in Japanese Unexamined Patent Publication No. H09-297549.

U.S. Pat. No. 7,377,787 proposes an illuminating device including a circuit board provided with a plurality of electrical components (LEDs) and connecting them operably, that is, a flexible board having a predetermined length, a conductive pattern formed on the flexible board, and a plurality of tabs arranged along a side edge of the flexible board, wherein at least one of the electrical components (LEDs) is connected through the conductive pattern in the respective corresponding tabs and each of the tabs has a circuit board with a tab capable of being bent from a first position in which the tab is arranged in a line with the residual boards to a second position in which the tab is turned at an angle (90 degrees) with respect to the residual boards, a plurality of light emitting diodes, a light diffusing member for receiving a light emitted from the light emitting diode, and the circuit board with the tab which is provided with the light emitting diode.

As described above, in the case in which the LED of the surface mounting type is mounted on the FPC, a perpendicular direction to an FPC plane is equivalent to a light emitting direction. For this reason, even if the FPC is bent, the light emitting direction does not take a shape conforming to the bending.

On the other hand, by using a lateral light emitting LED or a shell type LED, a light taking the shape conforming to the bending of the FPC is irradiated. Since the lateral light emitting LED or the shell type LED is used for special applications, however, a luminance or a type of a luminescent color is poor so that various customer needs cannot be satisfied.

Referring to the flexible linear luminous body disclosed in the Japanese Unexamined Patent Publication No. H09-297549, moreover, the FPC is not used. For this reason, a step of mounting an LED or a step of twisting a feed wire is required. Thus, a mass production has problems.

In the circuit board and the illuminating device using the same disclosed in the U.S. Pat. No. 7,377,787, an LED is mounted on an inside of a tab bent at a right angle to a circuit board body. For this reason, there is a problem in that a part of a light irradiated from the LED is intercepted by the circuit board body when the LED is lower than the circuit board body. When the LED is mounted on an outside of the tab, the LED and the light diffusing member are protruded outward from the tab. For this reason, a height of the whole illuminating device is increased. Moreover, a mounting position of the circuit board and the LED is shifted, and the circuit board is shifted from a center line if the LED is disposed on the center line. For this reason, there is a problem in that a stress is applied to the circuit board in use with bending. Furthermore, a conductive pattern for supplying a current to the LED to be mounted on the tab is formed on a single circuit board at both positive and negative sides. For this reason, a width of the circuit board cannot be decreased to be a certain value or more and a reduction in a size is therefore limited.

SUMMARY OF THE INVENTION

Therefore, it is an object of the present invention to provide a belt-like flexible LED light which can use a general surface mounting type LED having a large number of kinds, can be bent in any of an orthogonal direction to a light emitting direction and a vertical direction, is long and compact, applies a stress to a circuit board with difficulty, and is waterproof, the circuit board capable of implementing the same, and an LED illuminating device using the same.

In order to achieve the object, an LED mounting circuit board according to a first structure of the present invention is characterized in that an LED mounting portion having a plurality of LEDs mounted in an array is provided on a central part in a transverse direction of a long belt-like flexible board, both sides in a transverse direction of the LED mounting portion are provided with first and second boards in which at least two feed patterns for causing a current to flow to the LEDs are formed, and the LED mounting portion and the first and second boards are formed to be bendable.

In the LED mounting circuit board according to the first structure, the first board and the second board are formed to be bendable at both sides in the transverse direction around the belt-like LED mounting portion in which the LEDs are mounted in the array, and at least two feed patterns for causing a current to flow to the LED are formed on the first board and the second board. Since such a board structure is employed, it is possible to reduce the widths of the first board and the second board more greatly as compared with a single board having both of them formed thereon by distributing and forming the feed pattern on the first board and the second board in order to mainly dispose a positive feed wire of a DC power supply on the first board and to mainly dispose a ground feed wire on the second board. By mounting the LED on the LED mounting portion and bending the first and second boards toward an opposite side to the LED mounting portion, a light emitted from the LED can be prevented from being blocked by the first and second boards. In the case in which the LED to be mounted on the LED mounting portion has a single color, there are two feed patterns, that is, positive and ground feed patterns. For example, in the case of three colors of red, green and blue, there are four feed patterns in total, that is, three controlling feed patterns for individually controlling lighting for each color and a single common positive or ground feed pattern.

A second structure according to the present invention is characterized in that a plurality of coupling pieces for easily bending the first and second boards with respect to the LED mounting portion is formed at a predetermined interval in a longitudinal direction of the flexible board between the LED mounting portion and the first and second boards in the first structure. By the coupling piece, a bending rigidity is reduced so that the first and second boards can easily be bent with respect to the LED mounting portion.

A third structure according to the present invention is characterized in that the LED mounting portion has both ends in the transverse direction of the flexible board which are coupled to the first and second boards through the coupling piece, and is formed by discretely independent island-shaped LED mounting portions in the longitudinal direction of the flexible board in the second structure. When the first and second boards are bent with respect to the LED mounting portion so that the back surface of the first board and that of the second board are put together, consequently, the island-shaped LED mounting portions provided with the individual LEDs become independent. Consequently, a space is formed between the island-shaped mounting portions. When the bending is carried out in an orthogonal direction to the surfaces of the first and second boards which are orthogonal to the surface of the LED mounting portion, therefore, a stress applied to the LED mounting portion is reduced so that the bending can easily be performed.

A fourth structure according to the present invention provides a light emitting unit formed by mounting an LED and an electrical component on the LED mounting circuit board according to any of the first to third structures and bending at least one of the first board and the second board with respect to the LED mounting portion and a belt-like flexible LED light fabricated by covering the light emitting unit with a transparent or translucent flexible insulating material.

Consequently, it is possible to obtain a belt-like flexible LED light which can be bent in any of an orthogonal direction to a light emitting direction and a vertical direction, is long and compact, applies a stress to a circuit board with difficulty, and is waterproof.

A fifth structure according to the present invention is characterized in that the light emitting units are to be connected in a longitudinal direction to obtain a long LED illuminating device, at least one of the feed patterns of the LED mounting circuit board is sequentially connected through a long feeding conductive wire in the fourth structure. By using an electric wire capable of causing a large current to flow, consequently, it is possible to solve a problem in that a current capacitance cannot be increased with the feed pattern through the conductive film of the flexible board. Thus, it is possible to obtain a belt-like flexible LED light having a length of several meters. Furthermore, a heat generated in an electronic component such as an LED or a resistor can be radiated via the electric wire. Thus, the structure is compatible with the large current of the LED and a lifetime can be prolonged.

A sixth structure according to the present invention is characterized in that a light diffusion case is attached to an outer periphery of a cover of the light emitting unit in the fourth or fifth structure. Consequently, a light emitted from the individual LED is diffused in the longitudinal direction of the light diffusion case so that a linear light source can be obtained.

A seventh structure according to the present invention is characterized in that a lens functioning portion for converging or diffusing a light emitted from the LED is provided on an outer periphery of the cover of a flexible insulating material in the light emitting unit or integrally with the cover in the fourth or fifth structure. Consequently, it is possible to increase a range of the light in the case in which a wall surface is indirectly illuminated.

An eighth structure according to the present invention provides an LED illuminating device in which the belt-like flexible LED light in the fourth to seventh structures is attached to a flexible installation frame secured to an attached surface. Consequently, it is possible to obtain the LED illuminating device by attaching the belt-like flexible LED light to an attached surface of a wall surface, a construction or the like in a state in which a predetermined linear shape is taken.

According to the present invention, it is possible to obtain a belt-like flexible LED light which can use a general surface mounting type LED having a large number of kinds, can be bent in an orthogonal direction to a light emitting direction, is long and compact, applies a stress to a circuit board with difficulty, and is waterproof, the circuit board capable of implementing the same, and an LED illuminating device using the same.

BRIEF DESCRIPTION OF THE DRAWINGS

FIGS. 4A, 4B and 4C are views each showing the light emitting unit U according to the first embodiment of the present invention, FIG. 4A being a side view, FIG. 4B being a sectional front view and FIG. 4C being a plan view, FIGS. 10A and 10B are views each showing an example of the installation frame according to the first embodiment of the present invention, FIG. 10A being a perspective view showing a fixed installation frame and FIG. 10B being a perspective view showing a flexible installation frame, FIGS. 12A and 12B are views each showing an LED mounting circuit board according to a second embodiment of the present invention, FIG. 12A being a general plan view showing a single unit and FIG. 12B being an enlarged plan view showing a part of FIG. 12(A)

DETAILED DESCRIPTION OF THE INVENTION

Embodiments according to the present invention will be specifically described below with reference to the drawings.

Figure 1A:
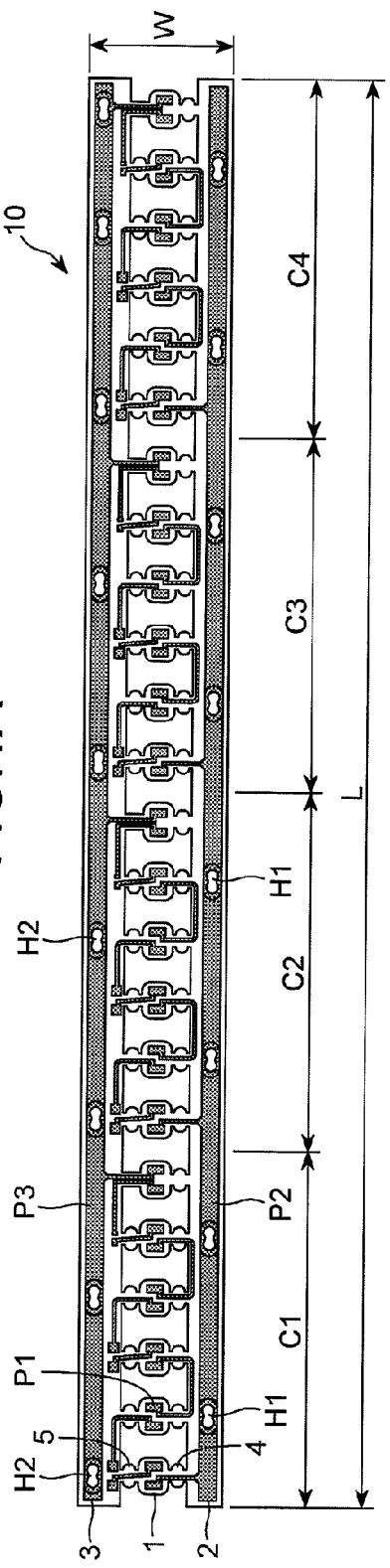
FIGS. 1A and 1B are views each showing an LED mounting circuit board according to a first embodiment of the present invention, FIG. 1A being a general plan view showing a single unit and FIG. 1B being an enlarged plan view showing a single circuit.
Figure 1B:
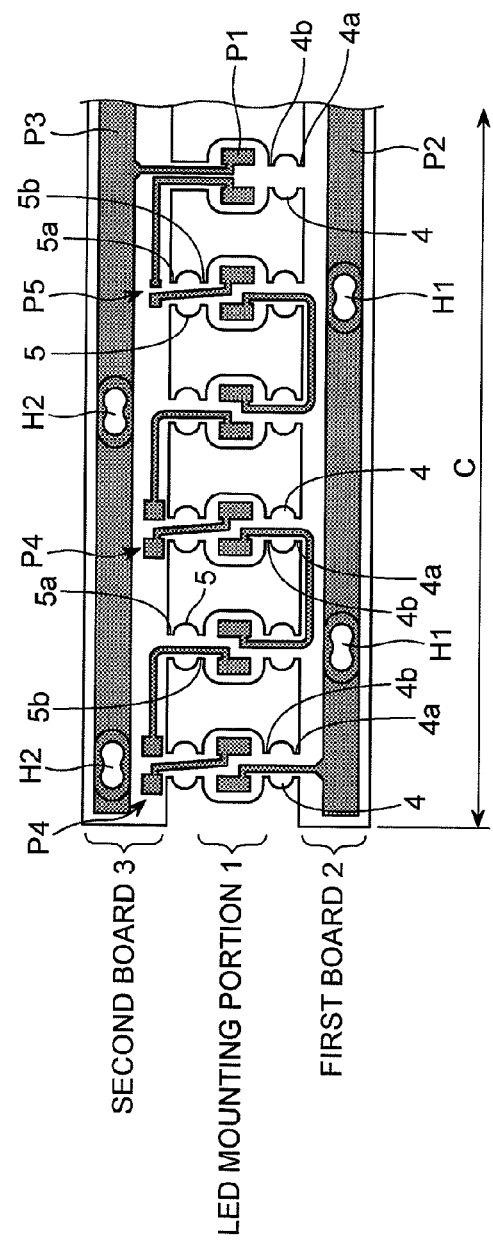

As shown in FIGS. 1A and 1B (FIG. 1A is a general plan view showing a single unit and FIG. 1B is an enlarged plan view showing a single circuit), an LED mounting circuit board (hereinafter referred to as a "circuit board") 10 according to a first embodiment of the present invention is provided with an LED mounting portion 1 in which a plurality of LEDs is mounted in an array on a central part in a transverse direction of a long belt-like flexible board, first and second boards 2 and 3 in which a feed pattern for causing a current to flow to an LED are provided on both sides in the transverse direction of the LED mounting portion 1, and the LED mounting portion 1 and the first and second boards 2 and 3 are formed to be bendable. In the present embodiment, the LED mounting portion 1 and the first board 2 are coupled through a coupling piece 4 having cut portions 4a and 4b provided on both ends, and the LED mounting portion 1 and the second board 3 are coupled through a coupling piece 5 having cut portions 5a and 5b provided on both ends. In a part of the coupling piece 5, it is hard to reduce a width because two conductive patterns are inserted through. For this reason, some coupling pieces 5 do not have the cut portions 5a and 5b formed thereon.

The LED mounting portion 1 has both ends in the transverse direction of the flexible board coupled to the first and second boards 2 and 3 through the coupling pieces, and is formed by discretely independent island-shaped LED mounting portions in a longitudinal direction of the flexible board. When the first and second boards 2 and 3 are bent with respect to the LED mounting portion 1 so that a back surface of the first board 2 and that of the second board 3 are put together (see FIG. 3E), consequently, the island-shaped LED mounting portions provided with the individual LEDs are independent. For this reason, a space is formed between the island-shaped LED mounting portions. When bending is carried out in an orthogonal direction to the surfaces of the first and second boards 2 and 3 which are orthogonal to the surface of the LED mounting portion 1, therefore, a stress applied to the LED mounting portion is reduced so that the bending can easily be performed.

An LED land P1 for mounting a surface mounting type LED is formed by a conductive pattern in the LED mounting portion 1, and a feed pattern P2 to which a positive voltage is applied from a DC power supply is formed on the first board 2 and a ground pattern P3 to be connected to a ground of the DC power supply is formed on the second board 3. Through holes H1 and H2 are provided on the feed pattern P2 and the ground pattern P3. The through holes H1 and H2 serve to carry out a connection to an external conductive wire by soldering at opposite surfaces to the patterns P2 and P3.

Figure 2:
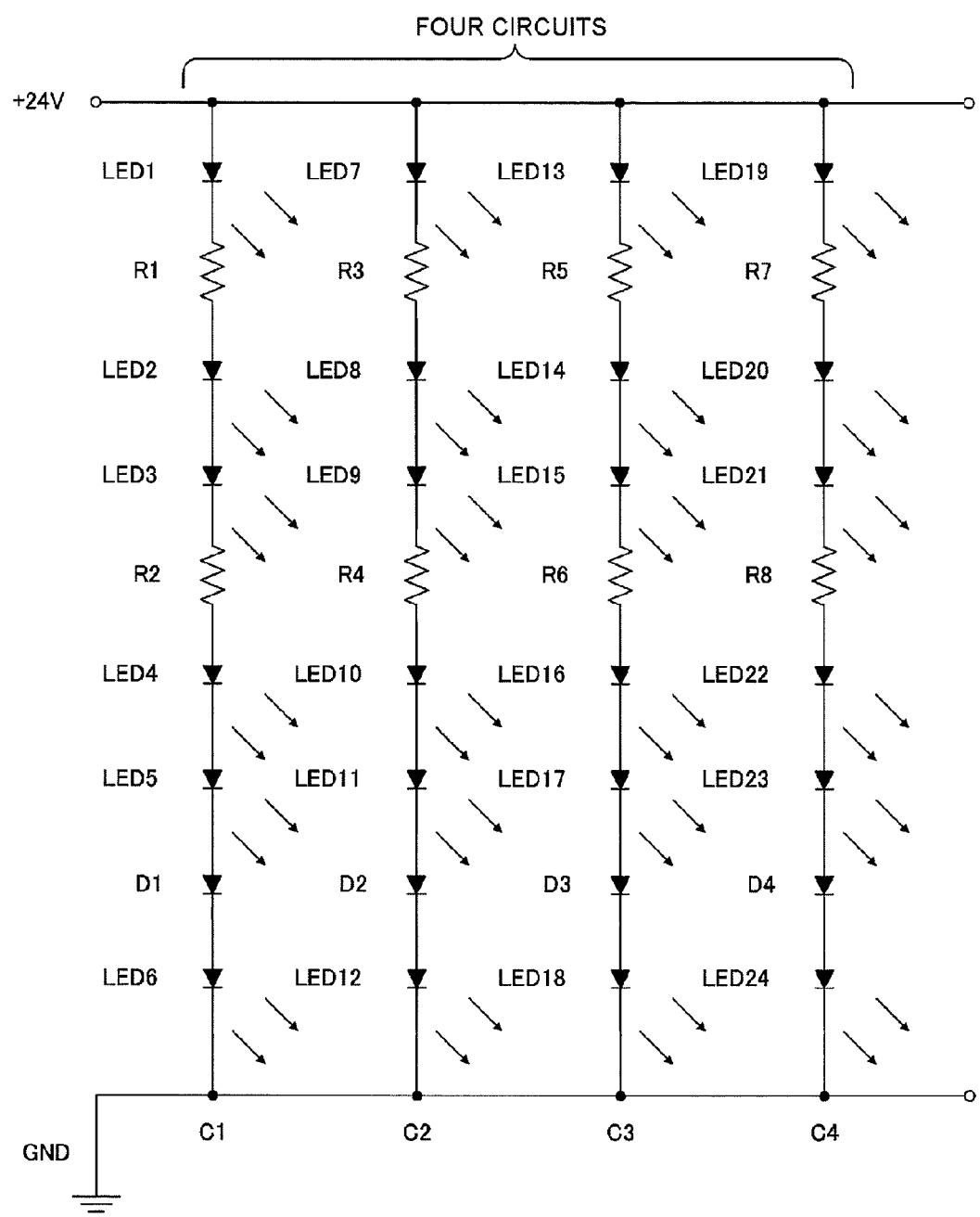
FIG. 2 is a circuit diagram showing a wiring state of an LED and an electrical component which are to be mounted on the circuit board according to the first embodiment of the present invention.

A resistor land P4 and a diode land P5 as well as the ground pattern P3 are formed on the second board 3. Four circuits C1 to C4 are formed in a single unit of the circuit board 10, and each of them has the same structure and they are constituted by LEDs 1 to 24, resistors R1 to R8 and reverse flow blocking diodes D1 to D4 which have structures in the circuit diagram shown in FIG. 2.

Although the circuit board 10 in the single unit has a length L of 240 mm and a width W of 24 mm, the board has a thickness of 100 μm and a copper lamination (a conductive pattern) has a thickness of 35 μm to 50 μm in the first embodiment, the present invention is not restricted thereto.

Although FIG. 1A shows the four circuits as the single unit, it is possible to obtain an illuminating device having a desirable length by connecting the feed patterns P2 and the ground patterns P3 in a large number of units through external conductive wires in parallel in order to implement a linear light source for several meters.

Figure 3:
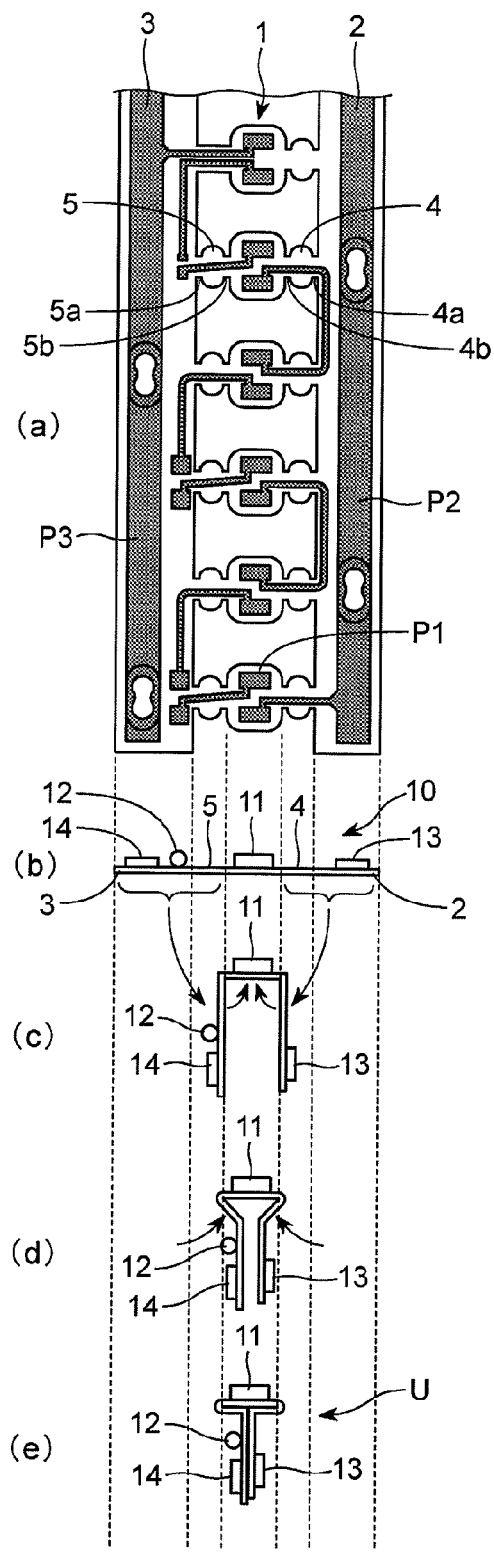
FIG. 3 is a view showing a process for mounting the LED and the electrical component on the circuit board according to the first embodiment of the present invention and carrying out an assembly into a light emitting unit U taking a T-shaped section, (a) being a plan view and (b) to (e) being sectional front views.

FIG. 3 shows a state in which a product obtained by the circuit board 10 provided with a surface mounting type LED 11 and an electrical component (a resistor or a diode in the present example) 12 and the feed pattern P2 and the ground pattern P3 having the conductive wires 13 and 14 soldered thereto is assembled into a light emitting unit U taking a T-shaped section. FIG. 3A is a plan view and FIGS. 3B to 3E are front views (sectional views). FIG. 3B shows a state in which the circuit board 10 has not been bent. In this state, the cut portions 4b and 5b are set to be bending portions and are thus bent at 90 degrees in a downward direction as shown in FIG. 3C. As shown in FIG. 3D, furthermore, the cut portions 4a and 5a are bent with the first board 2 and the second board 3 maintained in parallel in the downward direction as shown in FIG. 3D. As shown in FIG. 3E, finally, the back surfaces of the coupling pieces 4 and 5 come in contact with the back surface of the LED mounting portion 1 so that the back surfaces of the first board 2 and the second board 3 come in contact with each other. These back surfaces coming in contact with each other are bonded with an adhesive into the light emitting unit U having the T-shaped section. The back surfaces of the first board 2 and the second board 3 are not bonded to each other with the adhesive but can also hold an adhesion state by filling silicone rubber into a cover 17 which will be described below.

In the light emitting unit U, the first board 2 and the second board 3 having the back surfaces bonded to each other are integrated into a single flexible plate and the LED mounting portion 1 provided in an upper part forming the T-shaped section is separated from the adjacent LED mounting portion 1. Therefore, the whole light emitting unit U can be bent freely in an orthogonal direction to the surfaces of the first board 2 and the second board 3.

FIG. 4 shows the light emitting unit U, and FIG. 4A is a side view, FIG. 4B is a front view and FIG. 4C is a plan view. In these drawings, the light emitting units U are connected in parallel through conductive wires 13 and 14 for supplying a power. Power lead wires 15 and 16 are connected to ends of the conductive wires 13 and 14 of the first one of the light emitting units U through soldering. For the conductive wires 13 and 14, there is used a conductive wire capable of causing a larger current to flow than in a feed pattern through the conductive films of the first board 2 and the second board 3, for example, a copper plate, a solid wire, a twisted wire, a net wire or the like.

Figure 5A:
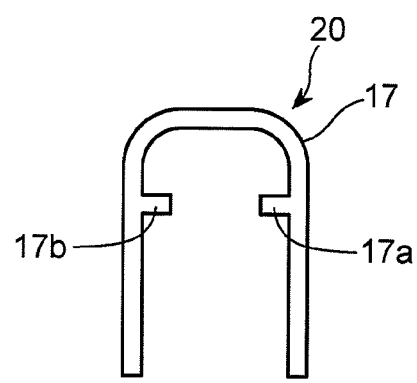
FIGS. 5A and 5B are views each showing a cover according to the first embodiment of the present invention, FIG. 5A being a sectional view and FIG. 5B being a sectional view showing a state in which the light emitting unit U is inserted.
Figure 5B:
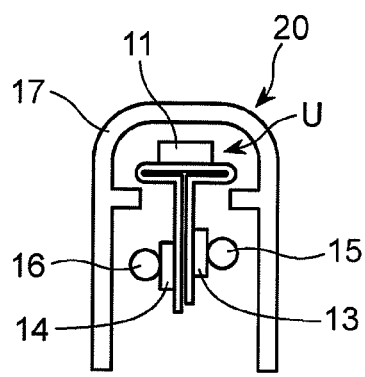
Figure 6A:
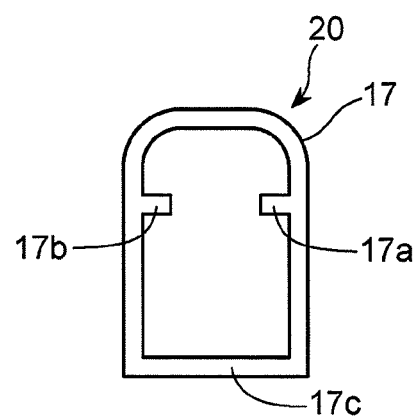
FIGS. 6A and 6B are views each showing another example of the cover according to the first embodiment of the present invention, FIG. 6A being a sectional view and FIG. 6B being a sectional view showing the state in which the light emitting unit U is inserted.
Figure 6B:
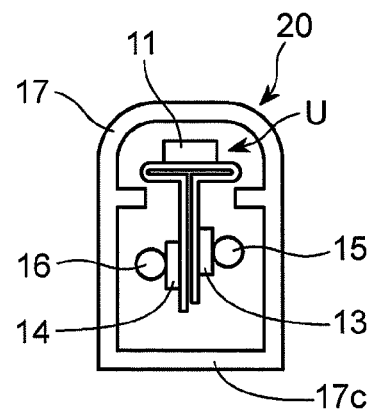
Figure 7A:
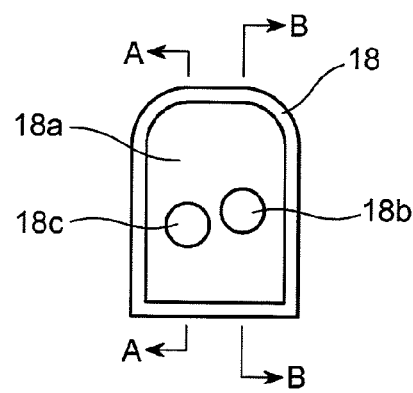
FIGS. 7A, 7B, 7C and 7D are views each showing an end cap according to the first embodiment of the present invention, FIG. 7A being a front view, FIG. 7B being a side view, and FIGS. 7C and 7D being an A-A sectional view and a B-B sectional view in FIG. 7A, respectively.
Figure 7B:
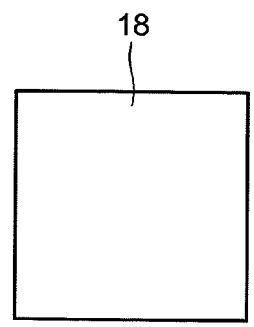
Figure 7C:
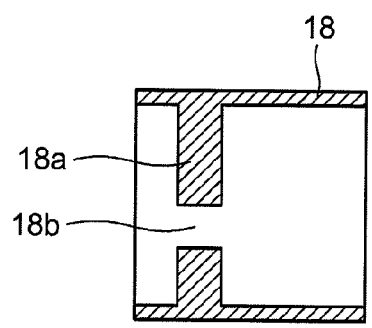
Figure 7D:
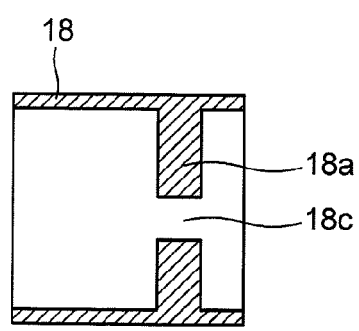

The transparent or translucent cover 17 having a section shown in FIG. 5A is put on the light emitting unit U. As a material of the cover 17, it is possible to use non-rigid plastic or silicone rubber which has a flexibility. Horizontal projections 17a and 17b are provided on an internal wall in an upper part of the cover 17, and lower ends of the LED mounting portion of the light emitting unit U having the T-shaped section are put thereon. The light emitting unit U is inserted from an end of the cover 17 to fill an inner part with the silicone rubber so that a belt-like flexible LED light 20 is fabricated as shown in FIG. 5B. The cover 17 may take a shape in which a bottom part is opened as shown in FIG. 5 or may take a closed shape having a bottom part 17c as shown in FIGS. 6A and 6B.

Figure 8A:
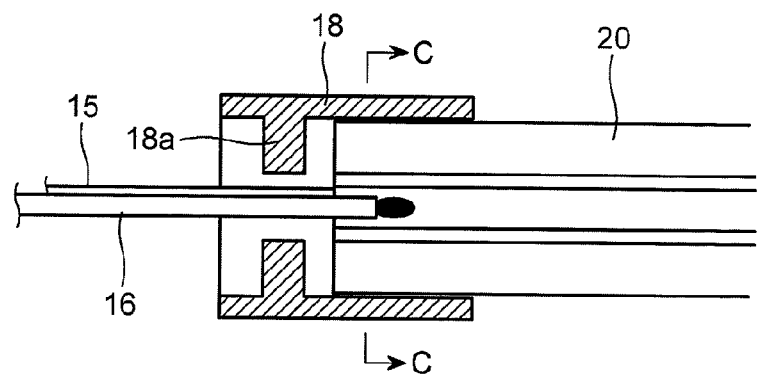
FIGS. 8A and 8B are views each showing a state in which an end of a belt-like flexible LED light is covered with the end cap according to the first embodiment of the present invention, FIG. 8A being a sectional side view and FIG. 8B being a C-C sectional view in FIG. 8A.
Figure 8B:
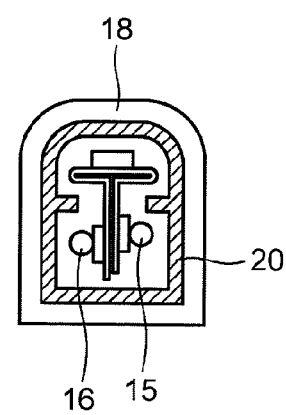

An end cap 18 shown in FIG. 7 is put on an end of the belt-like flexible LED light 20. Lead holes 18b and 18c for inserting the power lead wires 15 and 16 therethrough are provided on an internal wall 18a of the end cap 18. FIGS. 8A and 8B are a sectional side view and a front view showing a state in which the end cap 18 is put on the belt-like flexible LED light 20, respectively.

Figure 9:
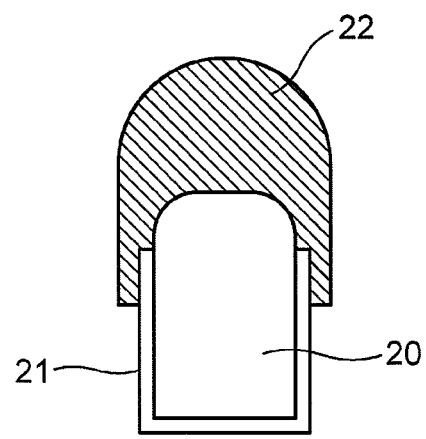
FIG. 9 is a sectional front view showing a state in which an installation frame and a light diffusion case are attached to the belt-like flexible LED light according to the first embodiment of the present invention.

An installation frame 21 is attached to the belt-like flexible LED light 20, and a light diffusion case 22 is attached or bonded to an upper part so that an LED illuminating device can be finished (see FIG. 9). The light diffusion case 22 is formed by milky white silicone rubber, for example, and serves to uniformly diffuse and discharge a light irradiated from the LED 11 to an outside.

For the installation frame 21, there are prepared a fixed installation frame 21A formed of aluminum or rigid plastic as shown in FIG. 10A and a flexible installation frame 21B formed of non-rigid plastic as shown in FIG. 10B. The fixed installation frame 21A is used for a straight part of a linear light source and the flexible installation frame 21B is used for a curved part. In the flexible installation frame 21B, a second wall 21d is formed on a large number of tongue pieces 21c provided continuously in a dividing state through a slit 21b from a plate-shaped first wall 21a. The first wall 21a can be bent in a direction of an arrow "a" and a direction of an arrow "b". The belt-like flexible LED light 20 is attached between the first wall 21a and the second wall 21d and can be thus used for both the straight part and the curved part. Both the fixed installation frame 21A and the flexible installation frame 21B are secured to a wall surface or an installation surface to attach the belt-like flexible LED light 20 and the light diffusion case 22 so that the LED illuminating device is obtained.

Figure 11:
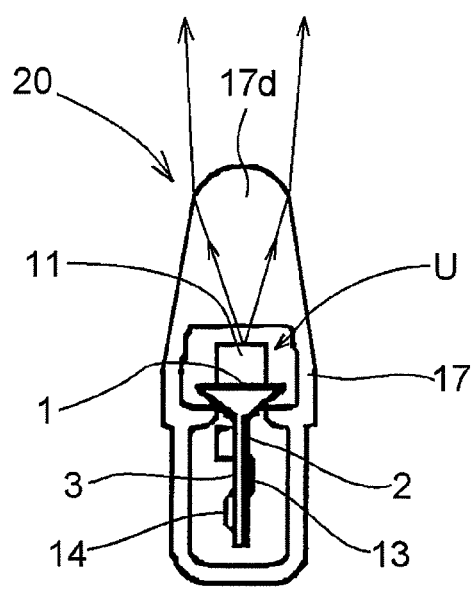
FIG. 11 is a sectional front view showing an example in which a cover is provided with a lens functional portion according to the first embodiment of the present invention.

FIG. 11 shows another example of the cover 17, in which a lens functioning portion 17d for converging a light emitted from the LED is provided integrally with the cover 17 of the light emitting unit U. Consequently, it is possible to increase a range of a light in the case of indirect illumination over a wall surface or the like. The lens functioning portion 17d does not need to be integrated with the cover 17 but can also be provided on an outer periphery of the cover 17.

Figure 13:
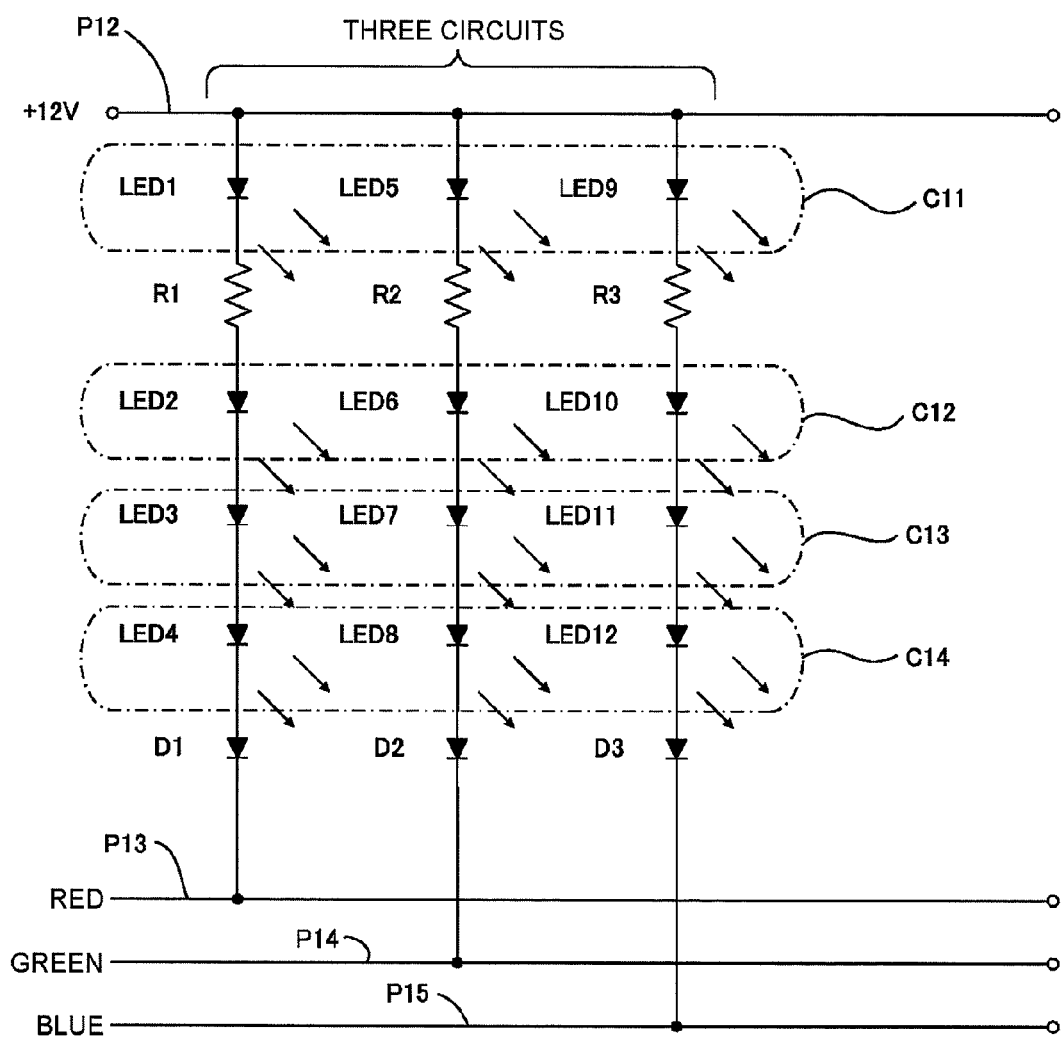
FIG. 13 is a circuit diagram showing a wiring state of an LED and an electrical component which are to be mounted on the circuit board according to the second embodiment of the present invention.

FIGS. 12 and 13 show an LED mounting circuit board according to a second embodiment of the present invention, and FIG. 12A is a general plan view showing a single unit and FIG. 12B is an enlarged plan view showing a part of FIG. 12A. FIG. 13 is a circuit diagram showing a wiring state of an LED and an electrical component which are mounted on the circuit board according to the second embodiment of the present invention.

An LED mounting circuit board (hereinafter referred to as a "circuit board") 30 according to the second embodiment of the present invention is provided with an LED mounting portion 31 in which a plurality of LEDs is mounted in an array on a central part in a transverse direction of a long belt-like flexible board, first and second boards 32 and 33 in which a feed pattern for causing a current to flow to an LED are provided on both sides in the transverse direction of the LED mounting portion 31, and the LED mounting portion 31 and the first and second boards 32 and 33 are formed to be bendable. In the second embodiment, the LED mounting portion 31 and the first board 32 are coupled to each other through a coupling piece 34 having cut portions 34a and 34b provided on both ends, and the LED mounting portion 31 and the second board 33 are coupled to each other through a coupling piece 35 having cut portions 35a and 35b provided on both ends. In a part of the coupling piece 35, it is hard to reduce a width because two conductive patterns are inserted through. For this reason, some coupling pieces 35 do not have the cut portions 35a and 35b formed thereon.

The LED mounting portion 31 has both ends in the transverse direction of the flexible board coupled to the first and second boards 32 and 33 through the coupling pieces, and is formed by discretely independent island-shaped LED mounting portions in a longitudinal direction of the flexible board. When the first and second boards 32 and 33 are bent with respect to the LED mounting portion 31 so that a back surface of the first board 32 and that of the second board 33 are put together, consequently, the island-shaped LED mounting portions mounting the individual LEDs thereon are independent. For this reason, a space is formed between the island-shaped LED mounting portions. When bending is carried out in an orthogonal direction to the surfaces of the first and second boards 32 and 33 which are orthogonal to the surface of the LED mounting portion 31, therefore, a stress applied to the LED mounting portion is reduced so that the bending can easily be performed.

An LED land P11 for mounting the surface mounting type LED is formed by a conductive pattern in the LED mounting portion 31, a feed pattern P12 to which a positive voltage is applied from a DC power supply and a first color controlling ground pattern P13 which is common to the LEDs for a first color (for example, a red color) are formed on the second board 33, and a second color controlling ground pattern P14 which is common to the LED for a second color (for example, a green color) and a third color controlling ground pattern P15 which is common to the LED for a third color (for example, a blue color) are formed on the first board 32. The feed pattern P12 and the ground patterns P13 to P15 have through holes H11 to H14 provided thereon. The through holes H11 to H14 serve to carry out a connection to external conductive wires on opposite surfaces of the patterns P12 to P15 through soldering.

A diode land P16 and a resistor land P17 as well as the patterns P12 to P15 are formed on the first board 32 and the second board 33. Four LED groups of C11 to C14 are disposed in the single unit of the circuit board 30 (FIG. 12 illustrates two units). Each LED group has the same structure and is constituted by LED 1 to LED 12, resistors R1 to R3, and reverse flow blocking diodes D1 to D3 in the structure of the circuit diagram shown in FIG. 13. Each of the LED groups C11 to C14 has LEDs for R, G and B disposed therein, and four LED groups for colors of B, G and R are disposed from left in the present example.

Although the circuit board 10 in two units has a length L of 240 mm and a width W of 24 mm, the board has a thickness of 100 μm and a copper lamination (a conductive pattern) has a thickness of 35 μm to 50 μm in the second embodiment, the present invention is not restricted thereto.

Since the other structures and functions are the same as those in the first embodiment, description will be omitted.

Figure 14A:
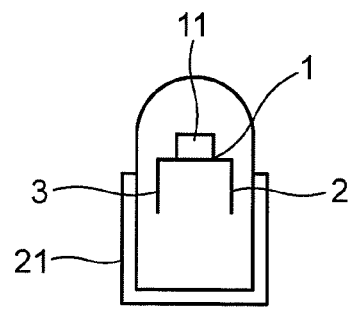
FIGS. 14A, 14B and 14C are sectional front views each showing an example of a separate structure from the LED illuminating devices according to the first and second embodiments of the present invention.
Figure 14B:
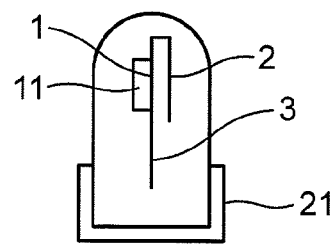
Figure 14C:
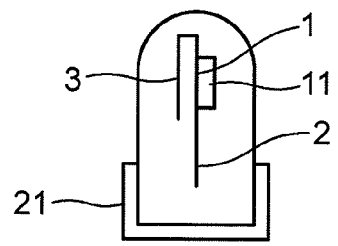

The LED mounting circuit board 10 takes a bending configuration having a T-shape section as in the first embodiment, and furthermore, is also compatible with a configuration in which the first board 2 and the second board 3 are bent at a right angle with respect to the LED mounting portion 1 to take a U shape and a flexibility is thus damaged as shown in FIG. 14A and a configuration in which the cut portion 4b or 5b is bent at 180 degrees with respect to the LED mounting portion 1 toward the opposite surface of the first board 2 or the second board 3 to set an irradiating direction of a light emitted from the LED 11 into a lateral direction as shown in FIGS. 14B and 14C. Consequently, the single circuit board 10 can take four configurations.

The present invention can be suitably utilized, in the field of various outdoor and indoor lighting, decorative illumination, guide lights or the like, as a belt-like flexible LED light which uses a general surface mounting type LED having a large number of kinds, can be bent in an orthogonal direction to a light emitting direction, is long and compact, applies a stress to a circuit board with difficulty, and is waterproof.

What is claimed is:

1. An LED mounting circuit board comprising:
   an LED mounting portion having a plurality of LEDs mounted in an array provided on a central part in a transverse direction of a long belt-like flexible board;
   a first board and a second board provided at both sides in a transverse direction of said LED mounting portion in which at least two feed patterns for causing a current to flow to the LEDs are formed; and
   a plurality of coupling pieces, each of whose length is about a half of a width of said LED mounting portion, formed at a predetermined interval in a longitudinal direction of said flexible board between said LED mounting portion and said first and second boards;
   wherein said coupling pieces are bendable with respect to said first or second board at first ends which are connected to said first or second board, and bendable with respect to said LED mounting portion at second ends which are connected to said LED mounting portion.

2. The LED mounting circuit board according to claim 1, wherein said coupling pieces have first cut portions formed at the first ends and second cut portions formed at the second ends for easily bending respectively.

3. The LED mounting circuit board according to claim 2, wherein the LED mounting portion has both ends in the transverse direction of the flexible board coupled to the first and second boards through said coupling pieces, and is formed by a plurality of discretely independent island-shaped LED mounting portions in the longitudinal direction of the flexible board.

4. A belt-like flexible LED light comprising,
   a light emitting unit formed by mounting an LED and an electrical component on said LED mounting circuit board according to claim 1, and formed into T-shaped section by bending said first board and said second board with respect to said LED mounting portion at 180 degrees downwardly about the second ends of said coupling pieces and then bending said first board and said second board with respect to said LED mounting portion at 90 degrees outwardly about the first ends so that said coupling pieces are folded to a backside of said LED mounting circuit board and the back surfaces of said first board and said second board come in contact with each other; and
   a cover covering the light emitting unit with a transparent or translucent flexible insulating material.

5. The belt-like flexible LED light according to claim 4, wherein when the light emitting units are to be connected in a longitudinal direction to obtain a long LED illuminating device, at least one of the feed patterns of the LED mounting circuit board is sequentially connected through a long feeding conductive wire.

6. The belt-like flexible LED light according to claim 4, wherein a light diffusion case is attached to an outer periphery of a cover of the flexible insulating material.

7. The belt-like flexible LED light according to claim 4, wherein a lens functioning portion for converging or diffusing a light emitted from the LED is provided on an outer periphery of a cover of the flexible insulating material in the light emitting unit or integrally with the cover.

8. An LED illuminating device wherein the belt-like flexible LED light according to claim 4 is attached to a flexible installation frame secured to an attached surface.

9. A belt-like flexible LED light comprising,
   a light emitting unit formed by mounting an LED and an electrical component on said LED mounting circuit board according to claim 2, and formed into T-shaped section by bending said first board and said second board with respect to the LED mounting portion about the second ends of said coupling pieces and then bending said first board and said second board with respect to said LED mounting portion about the first ends so that said coupling pieces are folded to a backside of said LED mounting circuit board and the back surfaces of said first board and said second board come in contact with each other; and
   a cover covering the light emitting unit with a transparent or translucent flexible insulating material.

10. A belt-like flexible LED light comprising,
    a light emitting unit formed by mounting an LED and an electrical component on said LED mounting circuit board according to claim 3, and formed into T-shaped section by bending said first board and said second board with respect to said LED mounting portion about the second ends of said coupling pieces and then bending said first board and said second board with respect to said LED mounting portion about the first ends so that said coupling pieces are folded to a backside of said LED mounting circuit board and the back surfaces of said first board and said second board come in contact with each other; and a cover covering the light emitting unit with a transparent or translucent flexible insulating material.

11. The belt-like flexible LED light according to claim 5, wherein a light diffusion case is attached to an outer periphery of a cover of the flexible insulating material.

12. The belt-like flexible LED light according to claim 5, wherein a lens functioning portion for converging or diffusing a light emitted from the LED is provided on an outer periphery of a cover of a flexible insulating material in the light emitting unit or integrally with the cover.

13. An LED illuminating device wherein the belt-like flexible LED light according to claim 5 is attached to a flexible installation frame secured to an attached surface.

14. An LED illuminating device wherein the belt-like flexible LED light according to claim 6 is attached to a flexible installation frame secured to an attached surface.

15. An LED illuminating device wherein the belt-like flexible LED light according to claim 7 is attached to a flexible installation frame secured to an attached surface.

\* \* \* \* \*